(12) United States Patent
Miller et al.

(10) Patent No.: US 7,230,594 B2
(45) Date of Patent: *Jun. 12, 2007

(54) COLOR OLED DISPLAY WITH IMPROVED POWER EFFICIENCY

(75) Inventors: Michael E. Miller, Rochester, NY (US); Ronald S. Cok, Rochester, NY (US); Andrew D. Arnold, Hilton, NY (US); Michael J. Murdoch, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 477 days.

This patent is subject to a terminal disclaimer.

(21) Appl. No.: 10/320,195

(22) Filed: Dec. 16, 2002

(65) Prior Publication Data

US 2004/0113875 A1   Jun. 17, 2004

(51) Int. Cl.
 *G09G 3/32* (2006.01)
(52) U.S. Cl. .............. 345/82; 345/83; 345/84; 345/76; 345/77; 345/690; 315/169.1; 315/169.3
(58) Field of Classification Search ............. 345/613, 345/694, 695, 589, 82–84, 77, 211, 76, 60–63, 345/690; 313/504, 506; 315/169.1, 169.3
See application file for complete search history.

(56) References Cited

U.S. PATENT DOCUMENTS

| | | | |
|---|---|---|---|
| 4,800,375 A * | 1/1989 | Silverstein et al. ......... 345/694 |
| 5,233,385 A | 8/1993 | Sampsell |
| 5,526,016 A * | 6/1996 | Nakagiri et al. ............ 345/111 |
| 5,563,621 A | 10/1996 | Silsby |
| 5,638,084 A | 6/1997 | Kalt |
| 6,075,514 A * | 6/2000 | Ryan ........................... 345/601 |
| 6,366,025 B1 * | 4/2002 | Yamada ................... 315/169.3 |
| 6,388,644 B1 | 5/2002 | DeZwart et al. |
| 6,498,592 B1 * | 12/2002 | Matthies ...................... 345/1.1 |
| 6,624,839 B2 * | 9/2003 | Gaudiana et al. ........... 347/238 |
| 6,693,611 B1 * | 2/2004 | Burroughes ................... 345/83 |
| 6,747,618 B2 * | 6/2004 | Arnold et al. ................. 345/77 |
| 2002/0024618 A1 * | 2/2002 | Imai ............................ 348/743 |

(Continued)

FOREIGN PATENT DOCUMENTS

EP           0 830 032 B1       3/2002

(Continued)

OTHER PUBLICATIONS

Klompenhouwer et al., "Subpixel Image Scaling for Color Matrix Displays," *SID 02 Digest*, pp. 176-179.

*Primary Examiner*—Richard Hjerpe
*Assistant Examiner*—Jennifer T. Nguyen
(74) *Attorney, Agent, or Firm*—Andrew J. Anderson; Thomas H. Close

(57) ABSTRACT

An OLED display device includes an array of light emitting pixels, each pixel having three or more OLEDs for emitting different colors of light specifying a gamut and at least one additional OLED for emitting a color of light within the gamut, wherein the power efficiency of the additional OLED is higher than the luminance efficiency of at least one of the three or more OLEDs; and means for driving the OLEDs in the pixels to produce a given color and luminance at a reduced power usage.

49 Claims, 12 Drawing Sheets

U.S. PATENT DOCUMENTS

2002/0050958 A1* 5/2002 Matthies et al. .............. 345/55
2002/0186214 A1* 12/2002 Siwinski .................... 345/212
2002/0196208 A1* 12/2002 Nanno et al.
2003/0103058 A1* 6/2003 Elliott et al.
2004/0051724 A1* 3/2004 Elliott et al.

FOREIGN PATENT DOCUMENTS

| JP | 2000-200061 | * | 2/2000 |
| WO | WO 00/11728 | * | 8/1999 |
| WO | WO 00/70400 | | 11/2000 |

* cited by examiner

COLOR OLED DISPLAY WITH IMPROVED POWER EFFICIENCY

FIELD OF THE INVENTION

The present invention relates to organic light emitting diode (OLED), full color display devices and, more particularly, to OLED color displays with improved power efficiency.

BACKGROUND OF THE INVENTION

Color, digital image display devices are well known and are based upon a variety of technologies such as cathode ray tubes, liquid crystal and solid-state light emitters such as Organic Light Emitting Diodes (OLEDs). In a common OLED display device, each display element or pixel, is composed of red, green, and blue colored OLEDs. By combining the illumination from each of these three OLEDs in an additive color system, a wide variety of colors can be achieved.

OLEDs may be used to generate color directly using organic materials that are doped to emit energy in desired portions of the electromagnetic spectrum. However, the known red and blue emissive materials are not particularly power efficient. In fact, broad bandwidth (appearing white) materials are known that have power efficiencies that are high enough by comparison to narrow bandwidth materials to produce a comparably power efficient OLED display by placing color filters over a broad bandwidth emissive material.

While power efficiency is always desirable, it is particularly desirable in portable applications because an inefficient display limits the time the device can be used before the power source is recharged. Portable applications may also require the display to be used in locations with high ambient illumination, requiring the display to provide imagery with a high luminance level to be useful, further increasing the power required to present adequate imagery.

In addition to the power efficiency of a display, another desirable attribute of a full color OLED display device is a reasonable color gamut. Color gamut is typically described by plotting the CIE chromaticity coordinates of the red 2, green 4 and blue 6 OLEDs in a CIE diagram as shown in FIG. 1. It should be appreciated, however, that to maximize the color gamut, the CIE chromaticity coordinates of the red 2, green 4, and blue 6 OLEDs must be separated as much as possible and placed on or very near the boundary of the CIE diagram. However, all of the colors on the boundary of this diagram are monochromatic and any source that can be placed near this boundary, by definition, emits light over a very narrow spectral band. For this reason, to create a display with a broad color gamut, the OLEDs must emit energy in a narrow spectral bandwidth.

Unfortunately, when a narrow bandwidth color filter is placed over a broad bandwidth light source to create an OLED element that emits light of a single color, the color filter absorbs more of the luminance energy of the illumination source than when a broad bandwidth filter is placed over the broad bandwidth light source. Similarly in OLED display devices that contain OLED materials that are doped to emit energy over narrow spectral bandwidths, the power efficiency of the OLED is reduced significantly.

The use of a broad bandwidth light emitting component is known in the prior art. For example, EP0830032B1 by Sampsell, Mar. 20, 2002, describes a projection system using a white light beam in conjunction with colored beams to improve the brightness of a projected display. Such a projection system, however, is not useful for an OLED display device. Further, this patent describes using the broad bandwidth white in a way that all colors will be perceived as lower in saturation. U.S. Pat. No. 5,526,016 issued Jun. 11, 1996 to Nakagiri et al., describes a rotary element of different colors to create a multi-color projection display. This projection device utilizes a white filter element to reduce the visibility of color breakup artifacts that are inherent in other similar color sequential display devices. This device is not suitable for small and compact display devices as required by portable application, has limited resolution, and is of very large size.

U.S. Pat. No. 5,638,084 issued Jun. 10, 1997 to Kalt, describes an electrostatically actuated display using red, green, blue, and white shutter elements. While the use of the white elements does improve the luminance of the display under certain circumstances, it does not alter the power used by the display system and the use of the white elements directly reduces that saturation of the displayed image to provide a higher luminance image.

U.S. Pat. No. 5,563,621 issued Oct. 8, 1996 to Silsby, describes a sixteen color display device that employs a pixel composed of red, green, blue, and white light emitting elements. While the addition of the white light emitting element allows the display to create four levels of gray through combinations of turning the white light emitting element on or off in combination with turning the red, green, and blue light emitting elements on and off, this patent does not discuss OLED display devices, nor does it discuss the creation of a full color display using a combination of red, green, and blue OLEDs.

U.S. Pat. No. 6,388,644 issued May 14, 2002 to DeZwart et al., describes a plasma or field emission display having "extra (non-saturating) phosphors" but does not address the need for reducing the power used by the display. As used in the '644 patent, the term "saturation" refers to an electronic saturation phenomenon relating to the efficiency of emission of photons from a phosphor that is stimulated by ultra violet photons, not color saturation as used in the present application.

There is a need, therefore, for an improved full color OLED display device having improved power efficiency while maintaining accurate color reproduction, including the saturation of in-gamut colors. As used below, the term "saturation" refers to color saturation (i.e. the purity of a color produced by the display device).

SUMMARY OF THE INVENTION

The need is met according to the present invention by providing an OLED display device that includes an array of light emitting pixels, each pixel having three or more OLEDs for emitting different colors of light specifying a gamut and at least one additional OLED for emitting a color of light within the gamut, wherein the power efficiency of the additional OLED is higher than the power efficiency of at least one of the three or more OLEDs; and means for driving the OLEDs in the pixels to produce a given color and luminance at a reduced power usage.

ADVANTAGES

The advantages of this invention are a color display device with improved power efficiency that also provides a desirable color gamut.

DETAILED DESCRIPTION OF THE INVENTION

The present invention is directed to a full color display device having three or more emissive OLEDs, providing three or more primary colors that define the gamut of the display, with one or more additional OLEDs having a color that is inside the gamut of the display and also having a higher power efficiency than the OLEDs that describe the gamut of the display. A signal processor associated with the display converts a standard color image signal to drive signals that drive the OLEDs to reduce the power usage of the display.

Figure 1:
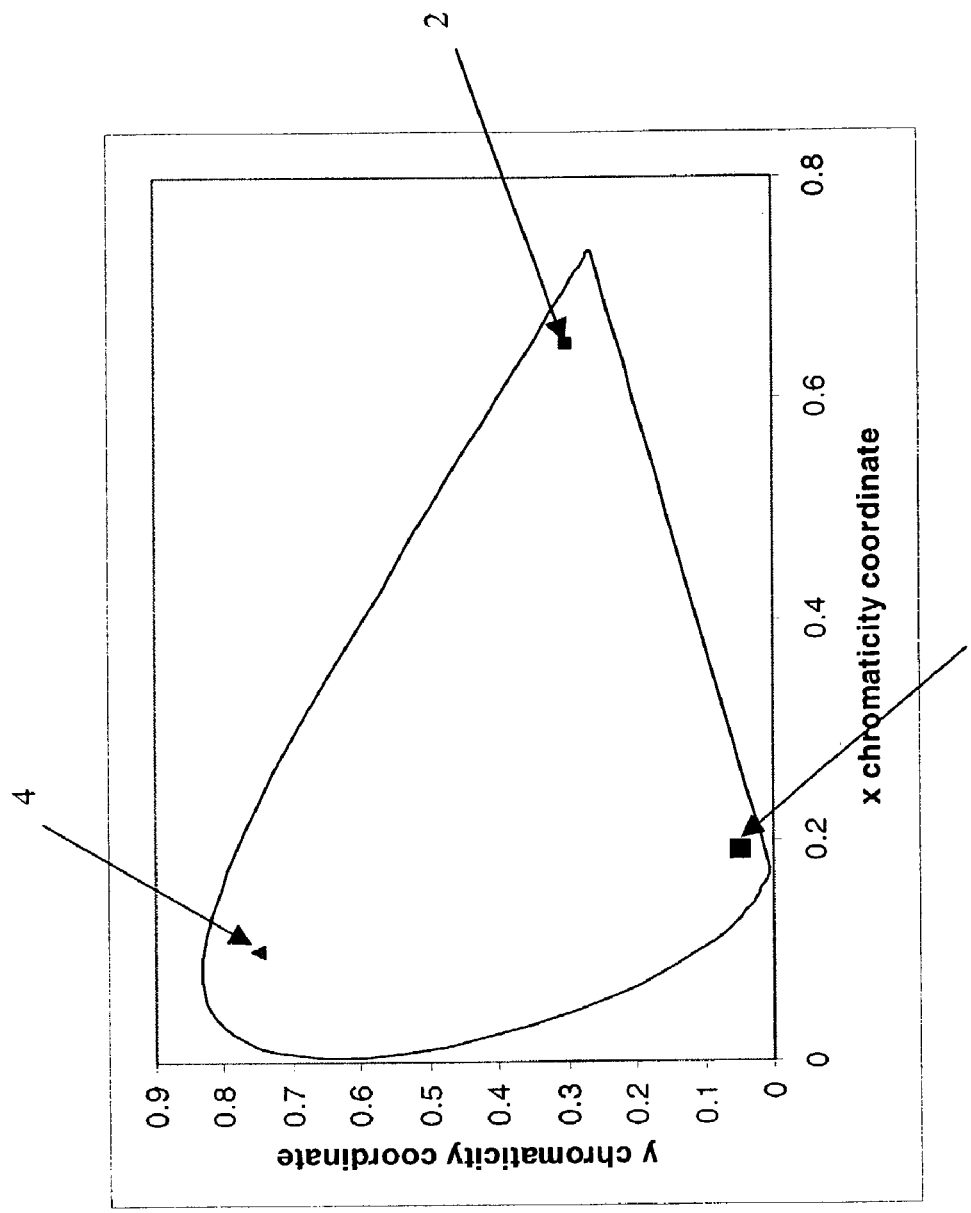
FIG. 1 is a CIE chromaticity diagram showing coordinates for highly saturated red, green, and blue OLEDs.
Figure 2:
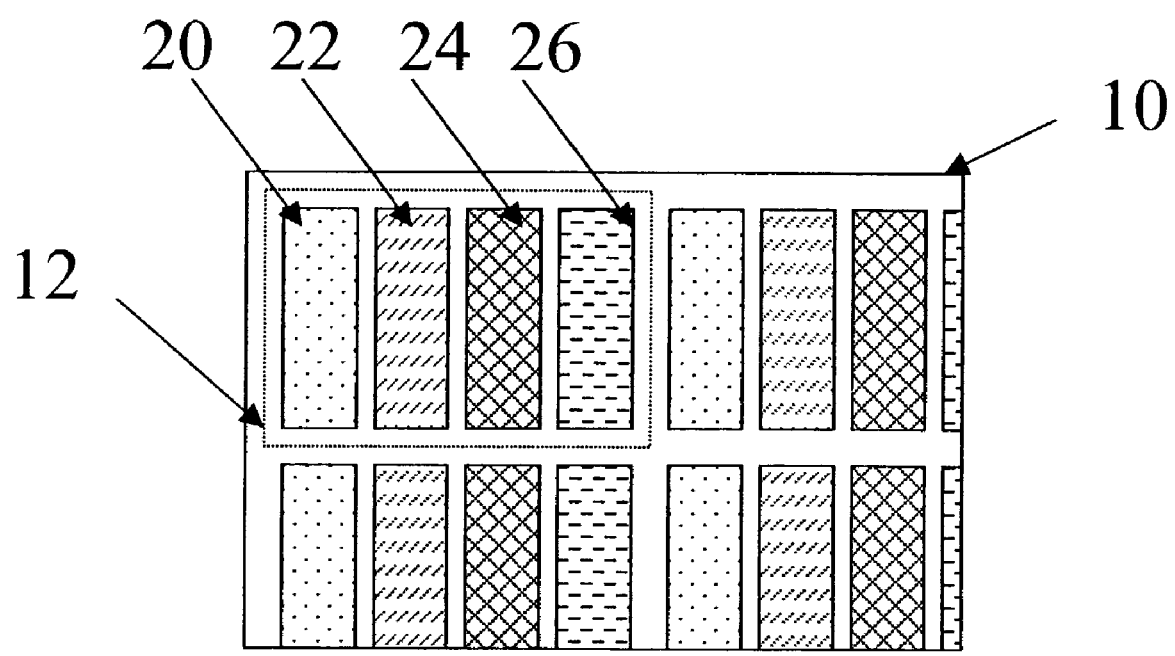
FIG. 2 is a schematic diagram illustrating a pattern of OLEDs according to one embodiment of the present invention.

Conventionally, full color display devices are constructed from three colored OLEDs: namely red, green, and blue. Referring to FIG. 2, an emissive color OLED display device 10 (a small portion of which is shown) according to the present invention includes an array of pixels; each pixel 12 is composed of three or more OLEDs that emit different colors of light that define the gamut of the display, for example, a red 20, a green 22, and a blue 24 light emitting OLED. The full color display of this invention additionally includes at least one in-gamut OLED 26, for example, a white light emitting OLED that has a power efficiency that is higher than at least one of the OLEDs that define the color gamut of the display. The OLEDs in the pixels are all individually addressable using conventional means where the power used by an OLED is proportional to its addressing level.

Figure 3:
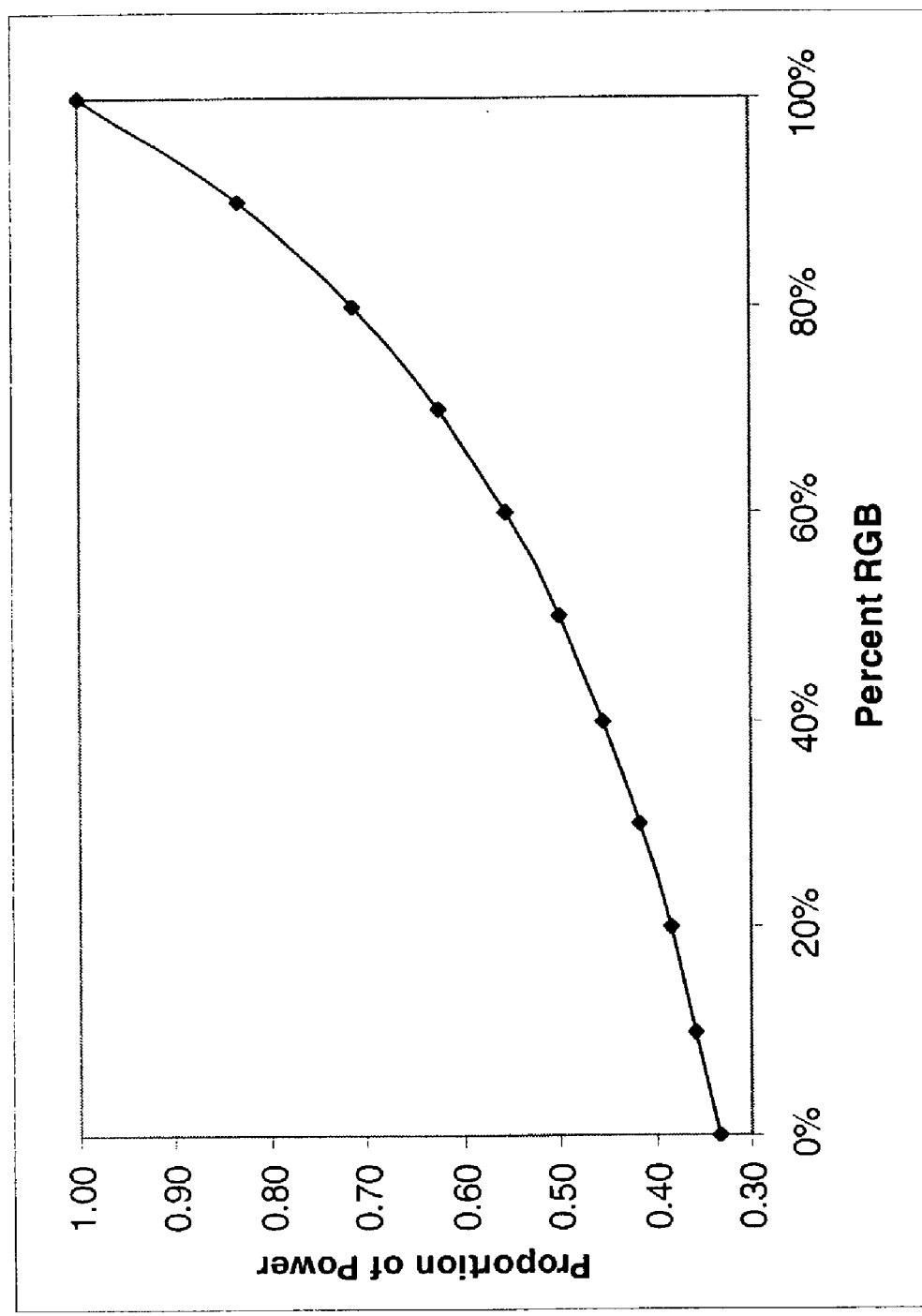
FIG. 3 is a graph showing the proportion of power that will be consumed by the display as power is removed from the OLEDs defining the gamut and applied to an in-gamut OLED.

According to the present invention, luminance that would conventionally be produced by a combination of lower power efficiency OLEDs defining the gamut of the display device can instead be produced by the higher power efficiency in-gamut OLED. Assuming that the OLEDs that define the gamut are on average one third as efficient as an in-gamut OLED, FIG. 3 illustrates the proportion of power that will be used by this display as a function of the percent of luminance that is produced by OLEDs on the gamut boundary as opposed to the in-gamut OLED. It is important to note, however, that to achieve this gain in power efficiency it must be possible to remove the power that would typically be used to illuminate the red, green, and blue OLEDs by removing power from the red, green, and blue OLEDs and applying this power to the in-gamut OLED. This function is provided by a signal processor that converts a standard color image signal to a power saving image signal that is employed to drive the display of the present invention.

The present invention can be employed in most OLED device configurations that allow four or more OLEDs per pixel. These include very unsophisticated structures comprising a separate anode and cathode per OLED to more sophisticated devices, such as passive matrix displays having orthogonal arrays of anodes and cathodes to form pixels, and active-matrix displays where each pixel is controlled independently, for example, with a thin film transistor (TFT).

Figure 4:
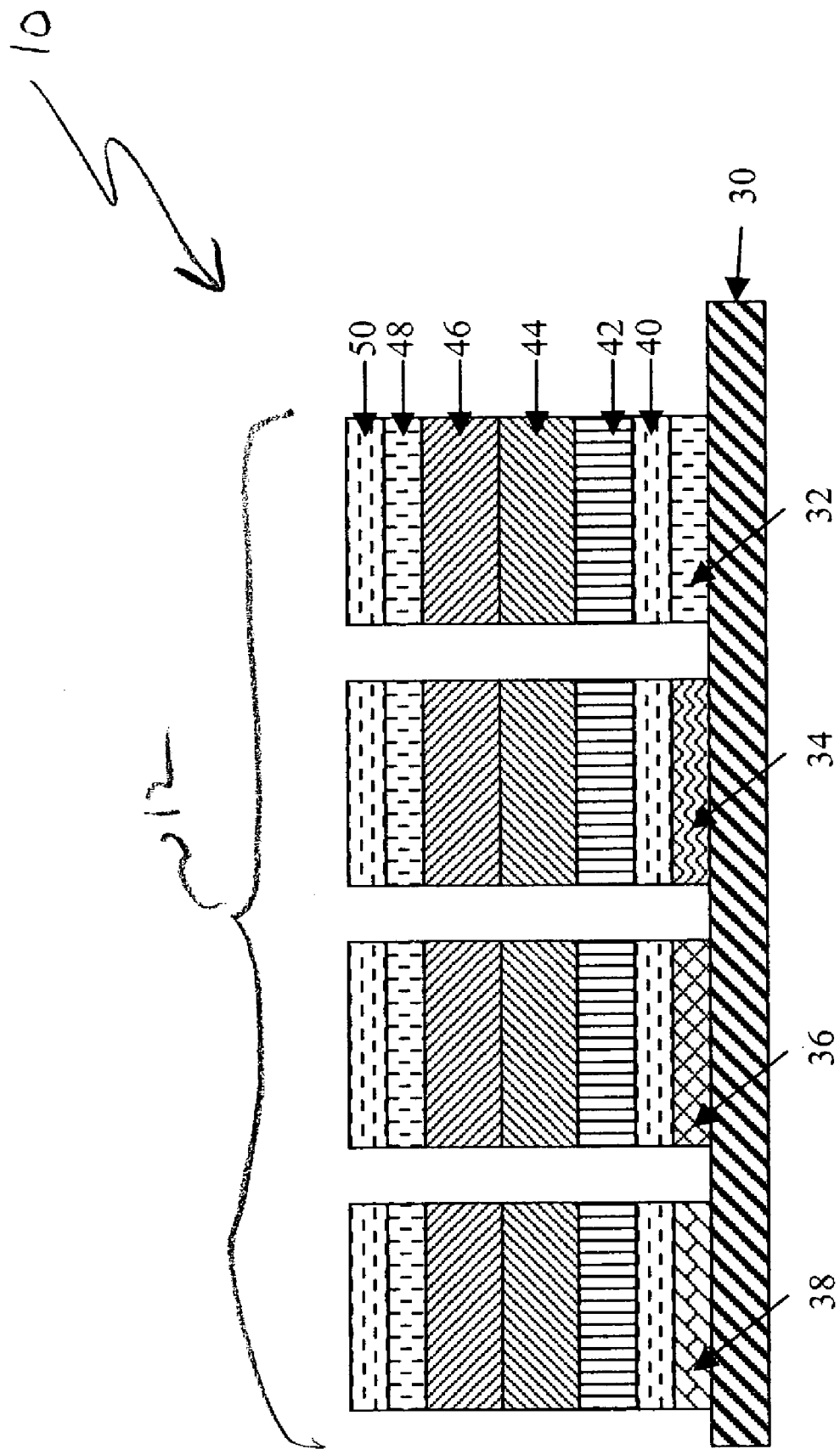
FIG. 4 is a schematic diagram illustrating a cross section of a series of OLEDs according to one embodiment of the present invention.

In a preferred embodiment, an OLED display includes pixels having a plurality of white light emitting OLEDs that are individually filtered using a color filter array to provide a color display. A schematic diagram of a cross section of such a display is shown in FIG. 4. There are numerous configurations of the organic layers wherein the present invention can be successfully practiced. A typical structure is shown in FIG. 4, each pixel 12 of the display device 10 has four OLEDs. Each OLED is formed on a transparent substrate 30. On this substrate are formed, red 32, green 34, blue 36, and white or transparent 38 color filters. While a white or transparent 38 color filter is shown in FIG. 3, it can also be understood that this filter may be omitted, allowing full transmittance of the energy from this OLED.

A transparent anode 40 is then formed over the color filter followed by the layers typically used to construct an OLED display. Here the OLED materials include a hole injecting layer 42, a hole transporting layer 44, a light emitting layer 46 and an electron transporting layer 48. Finally a cathode 50 is formed.

These layers are described in detail below. Note that the substrate may alternatively be located adjacent to the cathode, or the substrate may actually constitute the anode or cathode. The organic layers between the anode and cathode are conveniently referred to as the organic light emitting layer. The total combined thickness of the organic light emitting layer is preferably less than 500 nm. The device may be a top emitting device wherein light is emitted through a cover or a bottom emitting device that emits light through a substrate, as shown in FIG. 4.

A bottom emitting OLED device according to the present invention is typically provided over a supporting substrate 30 on which is patterned the color filters. Either the cathode or anode can be in contact with the color filters and the substrate. The electrode in contact with the substrate is conventionally referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

When EL emission is viewed through the anode 40, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

It is often useful to provide a hole-injecting layer 42 between the anode 40 and hole-transporting layer 44. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

The hole-transporting layer 44 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrene-sulfonate) also called PEDOT/PSS.

As more fully described in U.S. Pat. Nos. 4,769,292 and 5,935,721, the light-emitting layer (LEL) 46 of the organic light emitting layer includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,769,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2, 2', 2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer 48 of the organic light emitting layers of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 36 and 38 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

When light emission is viewed solely through the anode, the cathode 50 used in this invention can be comprised of nearly any conductive material. Desirable materials have good film-forming properties to ensure good contact with the underlying organic layer, promote electron injection at low voltage, and have good luminance stability over time. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL), which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

In the preferred embodiment, the display is capable of presenting all of the colors presented by a standard three color; red, green, blue OLED display device. In this preferred embodiment, the color of the white OLED 26 is designed to match the white point of the display. Within this embodiment, the signal processor used to drive the display is configured to allow any gray value, including white, which would typically be presented using a combination of the red 20, green 22, and blue 24 color OLEDs to be created using primarily the white OLED 26. To achieve this, the peak luminance of the white OLED 26 is designed to match the combined luminance of the red 20, green 22, and blue 24 OLEDs. That is, in a typical configuration where the prior art display would be designed to achieve a peak luminance of 100 cd/sq. m, the red 20, green 22, and blue 24 OLEDs will be set up to produce this peak luminance when they are all turned on to their maximum value and the white OLED 26 will also be designed to provide this same peak luminance.

It should be noted however, that under certain circumstances it may be desirable to design the color of the additional in-gamut OLED 26 to provide a color points other than the display white level inside the gamut of the red 20, green 22, and blue 24 OLEDs. For example by biasing the color of the additional or "white" OLED 26 towards the color of one of the other OLEDs, the designer reduces the reliance of the display on the red 20, green 22 or blue 24 OLED that the additional in-gamut OLED 26 is moved towards. It may also be desirable to set the peak luminance of the additional OLED 26 to other luminance values; including lower values, such as half the luminance of the peak luminance of the combined red 20, green 22 and blue 24 OLEDs which increases the reliance on the OLEDs that define the gamut of the display (20, 22, and 24) while reducing the reliance on the additional OLED 26. The peak luminance of the additional OLED 26 may also be designed to higher values, such as one and a half times the peak luminance of the combined red 20, green 22 and blue 24 OLEDs. However, this bias can result in loss of saturation for colors that are high in luminance that should be rendered as high in saturation.

Once the display is designed to provide the correct luminance value for each OLED, a suitable method is employed to map from a conventional three channel data stream to four colors in order to display standard video information on the display, which has more than three different colored OLEDs. Conventional color specifications can be converted to a red, green, blue, white specification using a suitable look-up table. Methods of generating lookup tables for converting a three color specification to drive a display having 4 or more color channels are well-known in the art, for example, U.S. Pat. No. 6,075,514 issued Jun. 13, 2000 to Ryan, provides one such method. Alternatively, the conversion may be accomplished real time using an algorithm that specifies the conversion.

Because the transform from three to four colors is non-deterministic, (i.e. many colors in the conventional specification can be created with either combinations of the colored OLEDs alone or in one of many combinations with the white OLED), different conversions are possible. However, by selecting the peak luminance of the white OLED 26 to match the combined peak luminances of the red 20, green 22, and blue 24, it is possible to perform the conversion to allow the additional in-gamut (white) OLED 26 to provide as much luminance to each color as possible while maintaining saturation of all colors. This approach provides the maximum power savings possible with the present invention.

Figure 5:
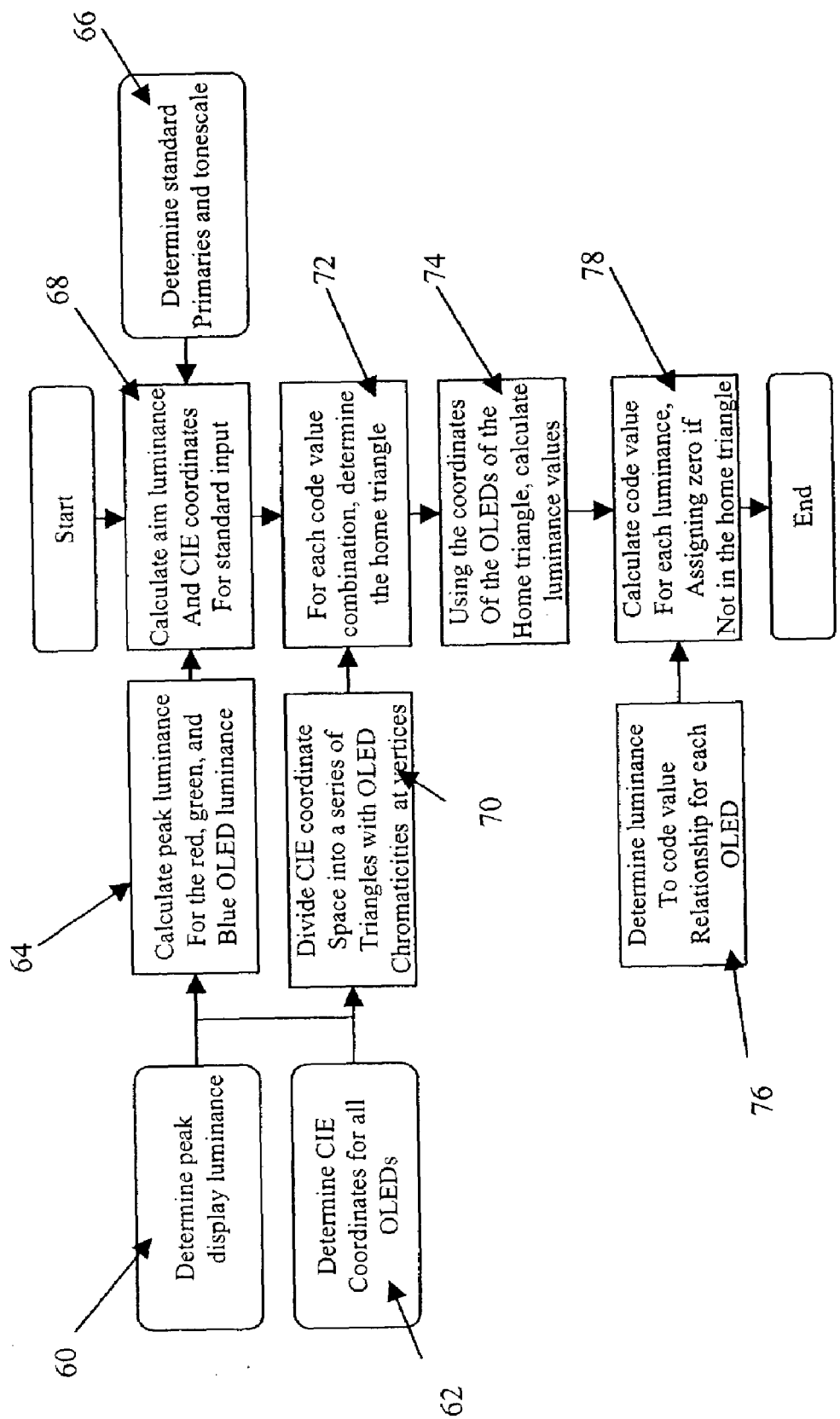
FIG. 5 is a flow chart illustrating the general concept of mapping from conventional three color data to four or more OLEDs without any loss in saturation.

A general method for constructing a look-up table to perform this conversion is depicted in FIG. 5. To perform the conversion, the desired peak luminance and the chromaticity coordinates of the desired white of the display are determined 60. The CIE chromaticity coordinates for each OLED are then determined 62. Using these values, the peak luminance is calculated 64 for the red 20, green 22, and blue 24, OLEDs using the following equations:

$$Y_r = \frac{y_r(x_w(-y_b + y_g) + x_g(y_b - y_w) + x_b(-y_g + y_w))Y_w}{(x_g y_b - x_r y_b - x_b y_g + x_r y_g + x_b y_r - x_g y_r)y_w} \quad (1)$$

$$Y_g = \frac{y_g(x_w(y_b - y_r) + x_b(y_r - y_w) + x_r(-y_b + y_w))Y_w}{(x_g y_b - x_r y_b - x_b y_g + x_r y_g + x_b y_r - x_g y_r)y_w} \quad (2)$$

$$Y_b = \frac{y_b(x_w(-y_g + y_r) + x_r(y_g - y_w) + x_g(-y_r + y_w))Y_w}{(x_g y_b - x_r y_b - x_b y_g + x_r y_g + x_b y_r - x_g y_r)y_w} \quad (3)$$

where: $Y_W$ represents the desired peak luminance (i.e., the luminance of the final display device when the display device is turned on to its maximum value); $X_W$ and $y_W$ represent the chromaticity coordinates of the desired display white point; $Y_r$, $Y_g$, and $Y_b$ represent the peak luminance values required for the display device to produce the desired white luminance; $x_r$, $x_g$, and $x_b$ represent the respective x chromaticity coordinates of the red, green, and blue OLEDs in the display device; and $y_r$, $y_g$, and $Y_b$ represent the respective y chromaticity coordinates of the red, green, and blue OLEDs in the display device.

The CIE chromaticity coordinates and tonescale for the standard video input are then determined 66. Using this data and the peak luminance for the red, green, and blue display device luminance, the aim luminance and CIE chromaticity coordinates are calculated 68 for all possible code value combinations.

Using the CIE chromaticity coordinates for each of the OLEDs, the CIE coordinate space is then divided 70 into a series of n−1, non-overlapping triangular regions where n is the number of OLEDs with different CIE chromaticity coordinates. This division may be done in a number of ways. For example, appropriate triangles are formed by connecting the CIE color coordinate of the white OLED to the CIE color coordinate of each of the red, green, and blue OLEDs, the three appropriate triangles being formed by the combination of the CIE chromaticity coordinates of the white OLED with each of the possible combinations of the CIE chromaticity coordinates for the red, green, and blue OLEDs. If more than one in-gamut OLED is provided, line segments are drawn initially between the CIE chromaticity coordinates of the in-gamut OLEDs and then these line segments are connected to the OLEDs that define the gamut of the display. In this way, the use of the additional in-gamut OLED(s) are maximized, providing improved display device power efficiency.

Using the aim CIE chromaticity coordinates calculated 68 earlier for each possible code value, the home triangle of the chromaticity coordinates of each of these code value combinations is then determined 72. That is, the triangle containing the chromaticity coordinates of each color defined by each code value combination is determined and that triangle is defined as the home triangle. It is recognized that the desired chromaticity coordinates for some code value combinations may lie on a boundary or vertex of one of these triangles, in which case this value may be arbitrarily assigned to any of the possible home triangles for this code value combination. Once the home triangle for each code value combination is defined 72, the amount of luminance contributed by each of the OLEDs, whose chromaticity coordinates form the home triangle for each code value combination, is calculated 74 from the following equations:

$$Y_1 = \frac{y_1(x_a(-y_3 + y_2) + x_2(y_3 - y_a) + x_3(-y_2 + y_a))Y_a}{(x_2y_3 - x_1y_3 - x_3y_2 + x_1y_2 + x_3y_1 - x_2y_1)y_a} \quad (4)$$

$$Y_2 = \frac{y_2(x_a(y_3 - y_1) + x_3(y_1 - y_a) + x_1(-y_3 + y_a))Y_a}{(x_2y_3 - x_1y_3 - x_3y_2 + x_1y_2 + x_3y_1 - x_2y_1)y_a} \quad (5)$$

$$Y_3 = \frac{y_3(x_a(-y_2 + y_1) + x_1(y_2 - y_a) + x_2(-y_1 + y_a))Y_a}{(x_2y_3 - x_1y_3 - x_3y_2 + x_1y_2 + x_3y_1 - x_2y_1)y_a} \quad (6)$$

where: $Y_a$ represents the desired luminance for the code value combination as calculated 68 earlier; $x_a$ and $y_a$ represent the chromaticity coordinates for the code value combination as calculated 68 earlier; $Y_1$, $Y_2$, and $Y_3$ represent the luminance values of the three OLEDs defining the first, second, and third corners of the home triangle, respectively; $x_1$, $x_2$, and $X_3$ represent the respective x chromaticity coordinates of the first, second and third corners of the home triangle; and $y_1$, $y_2$, and $y_3$ represent the respective y chromaticity coordinates of the first, second, and third corners of the home triangle.

A relationship defining the luminance of each OLED to the code value for each OLED is then determined 76. Using this relationship, the code value for each OLED luminance that was calculated 74 for each code value combination is finally calculated 78 and placed into the output of the look-up table. Any OLED that was not a part of the home triangle that was defined for each standard code value combination is assigned a code value of 0 in the final look up table.

It will be appreciated by one skilled in the art, that under certain circumstances (e.g., to avoid the visibility of spatial artifacts), it may be desirable to have the colors that are not part of the home triangle for each color combination provide some non-zero luminance. For example, to provide a flat field when displaying a solid white area on a display device with reasonably large pixels and improve the image quality of the display, it may be desirable to have some proportion of the white luminance produced by the white OLED and the remaining luminance produced by the combination of the OLEDs that form the gamut boundary. In this case, a weighted average may be produced between the luminance values calculated in step 68 and the luminance values calculated in step 74. This weighted average may then be used to perform step 78. It may also be recognized that for the combination of more than one in-gamut color, it is possible to draw more than one set of non-overlapping triangular regions within the CIE chromaticity coordinate space and that it may be further desirable to perform steps 70 through 74 for all possible triangular regions and then provide a weighted average of all possible combinations in combination with the values determined in step 68. This weighted average may then be provided as an input to step 78. Further, this weighted combination may be provided for all possible code value combinations or different weighted combinations may be provided for different subsets of the possible code value combinations.

A general graphical approach to determine the conversion from conventional three channel data stream to the display device of the present invention has been described above. One skilled in the art will understand that this general graphical approach may be implemented using different mathematical approaches. A particularly useful approach to this problem employs a linear algebra approach. One such approach that may be used to convert the data from video RGB signals to the four color display of the present invention is shown in FIG. 6.

Figure 6:
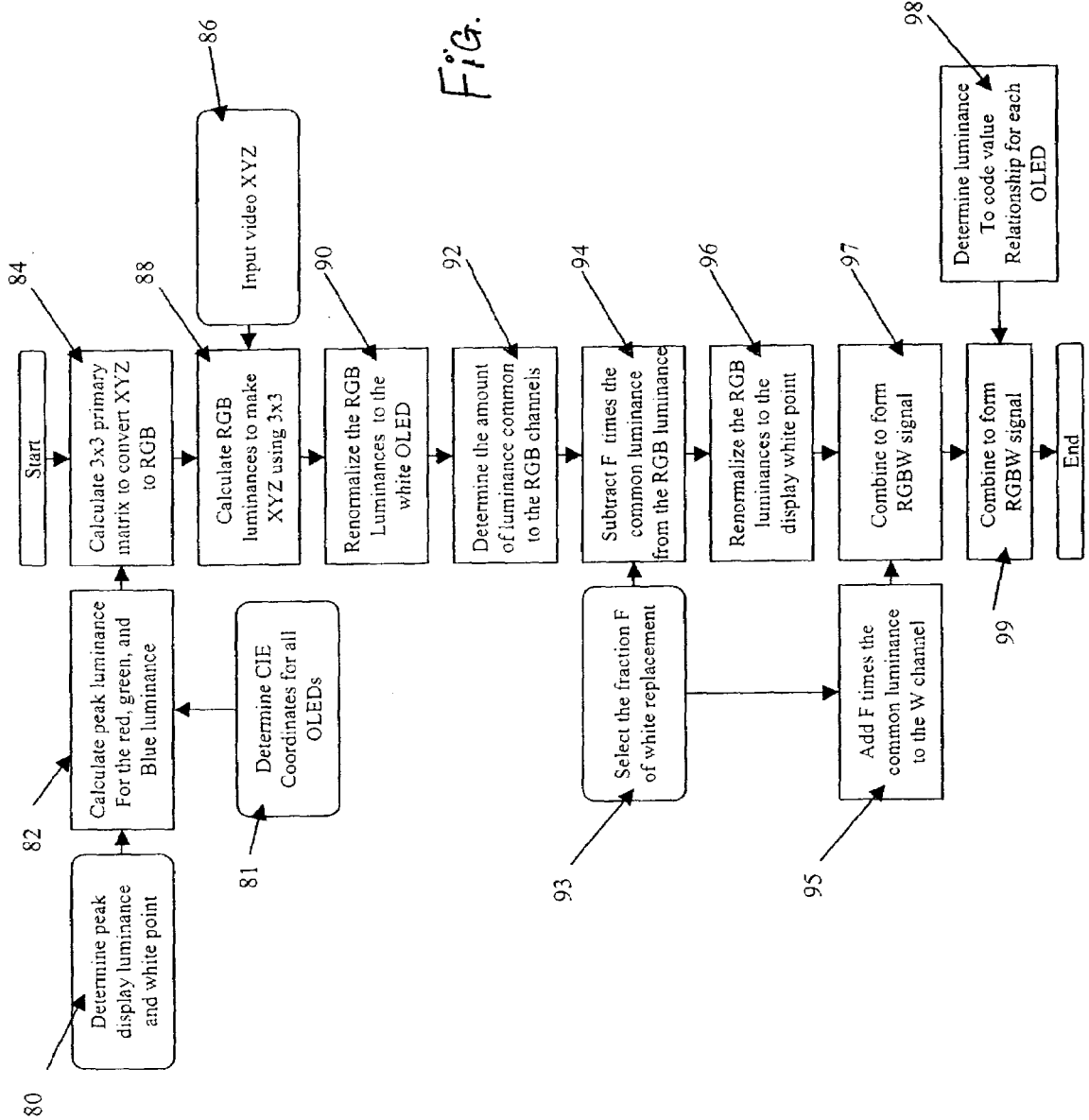
FIG. 6 is a flow chart illustrating an algorithm useful for programming a computer for mapping from conventional three color data to four OLEDs without any loss in saturation.

The approach depicted in FIG. 6 allows the replacement of a fraction of the white luminance that would typically be generated by the red, green, and blue OLEDs to be produced by the additional (white) OLED. At a fraction of 0, no white replacement is made, and the display is identical in operation to a three color display. At a fraction of 1.0, full white replacement is made, meaning that at any pixel location, excepting those where subpixel spatial interpolation is done, at least one of the red, green, and blue OLEDs will be off or at minimum luminance, and for the majority of colors, the white OLED will be at least partially lit.

The white replacement algorithm is depicted in FIG. 6. Using this approach, the desired peak luminance and chromaticity coordinates of the display white point are determined 80. The CIE chromaticity coordinates for each OLED are then determined 81. Using these values, the peak luminance is calculated 82 for the red 20, green 22, and blue 24, OLEDs using equations 1, 2 and 3 as shown earlier.

Using this data and the peak luminance for the red, green and blue display device luminance, a 3×3 matrix is calculated 84. The XYZ tristimulus values of the RGB video are input 86. The red, green, and blue luminance values are then calculated 88 using the 3×3 matrix that was calculated 84 earlier to rotate from the primaries associated with CIE XYZ tristimulus values to the RGB luminances of the display. These luminances are renormalized from the white point of the display to the peak luminance of the white OLED 90, and the common luminance, i.e., the minimum of the three, is calculated 92. A white replacement fraction (F) is selected 93.

The multiple of F and the common luminance is subtracted 94 from each of the red, green, and blue luminances that were calculated 92 earlier. This luminance is then added 95 to the luminance of the white OLED, previously zero. The luminance values for the red, green, and blue OLEDs are renormalized 96 to the display white point, and combined 97 with the luminance value for the white OLED. A lookup table to convert from luminance of the red, green, blue and white OLED to the code value required to produce each luminance is then determined 98. This lookup table is then applied to determine 99 the code values necessary to drive each OLED to its desired luminance.

It is worth noting that fractions greater than 1.0 may be considered when applying this approach, but not without compromising the colorimetric accuracy of the display. Many variations are possible, such as not subtracting F times the common luminance from the RGB channels when adding it to the white channel, or such as simply adding some fraction F2 of the maximum luminance of the RGB channels to the white channel. Either approach will provide a display whose peak white luminance is improved but whose color saturation is diminished.

It should be noted, that the color processing above does not consider the spatial layout of the OLEDs within the display device. However, it is known that traditional input signals assume that all of the OLEDs used to compose a pixel are located in the same spatial location. Visually apparent artifacts that are produced as a result of having the different colored OLEDs at different spatial locations are often compensated through the use of spatial interpolation algorithms, such as the one discussed by Klompenhouwer et al. entitled "Subpixel Image Scaling for Color Matrix Displays". These algorithms will, depending upon the spatial content of the image, adjust the drive signal for each OLED to reduce the visibility of spatial artifacts and improve the image quality of the display, particularly near the edges of objects within the image and will be applied in conjunction with or after the before mentioned color processing is applied. It should be noted that the image quality improvement that is obtained near the edges of objects within the image is derived from increased sharpness of edges, decreases in the visibility of color fringing and improved edge smoothness.

Applying either of the above described methods to generate colors on a display device of the current invention in actual practice, allows the additional (white) OLED 26 to be presented with little or no color filtering while the remaining OLEDs have a color filter. This fact implies that this OLED will not be driven to as high a drive level as the red 20, green 22, and blue 24 OLEDs to achieve the maximum luminance output. Since the lifetime of OLED materials are influenced significantly by the power at which they are driven, one might expect considerable improvement in the lifetime of this OLED display device over an OLED display device of the prior art. It is also true that the amount of utilization of each OLED will be different. For this reason, one may wish to apply different sized OLEDs to optimize the lifetime of the display as described in co-pending application U.S. Ser. No. 10/224,239 filed Aug. 20, 2002 by Arnold et al.

Figure 7:
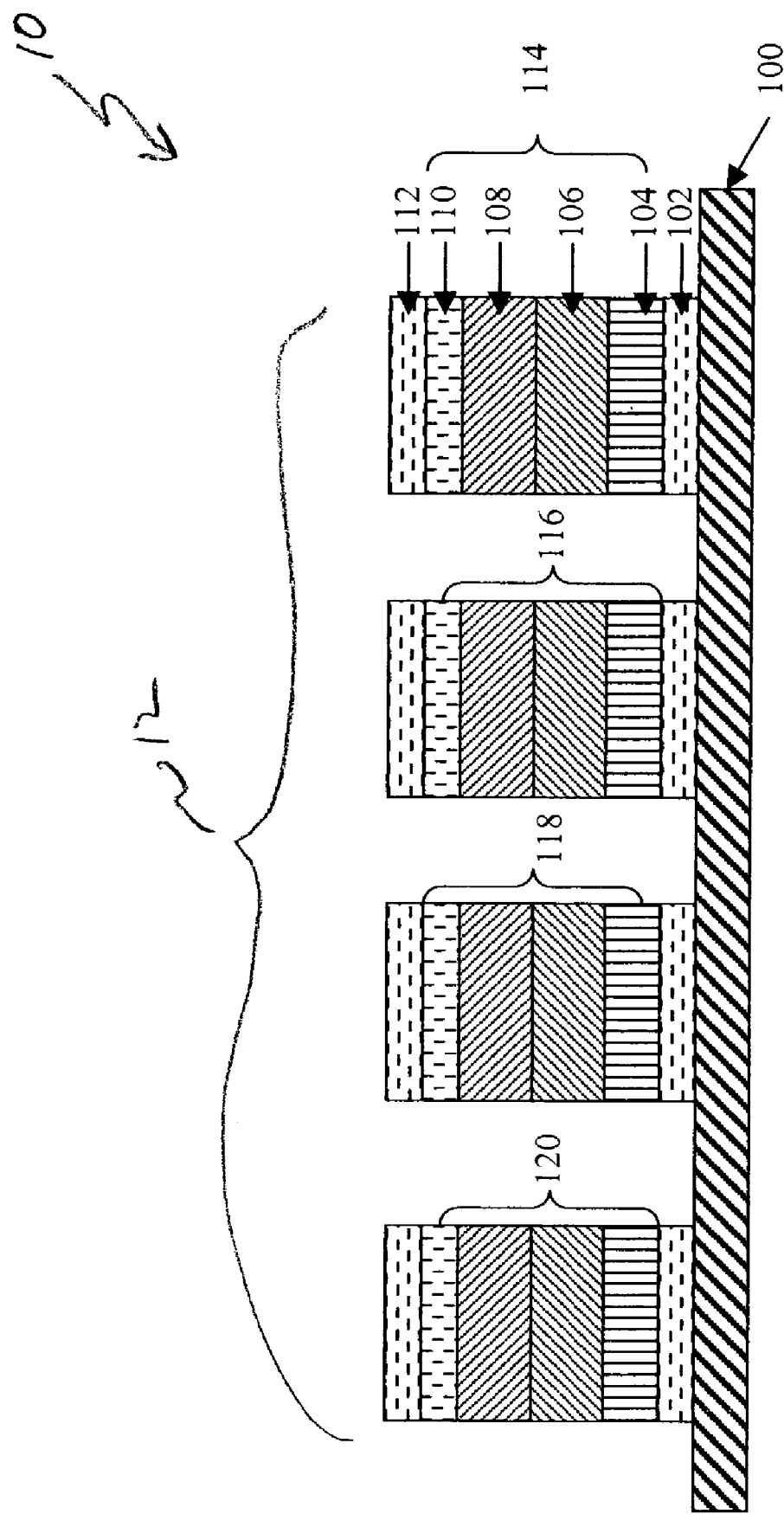
FIG. 7 is a schematic diagram illustrating a cross section of a series of OLEDs according to an alternative embodiment of the present invention.

Various other embodiments of this invention may also be practiced. A second particularly useful embodiment includes the use of several different OLED materials that are doped to provide multiple colors. For example, the red 20, green 22, blue 24 and white 26 OLEDs may be composed of different OLED materials that are doped to produce different colored OLEDs. This embodiment is illustrated in FIG. 7 which includes a plurality of OLEDs that are formed on a transparent substrate 100. On this substrate is formed an anode 102. On each anode is formed a stack of organic light emitting diode materials 114, 116, 118, and 120. Over the organic light emitting diode materials a cathode 112 is formed. Each of the organic light emitting diode material stacks (e.g., 114, 116, 118 and 120) are formed from a hole injecting layer 104, a hole transporting layer 106, a light emitting layer 108, and an electron transporting layer 110.

In this embodiment, the light emitting layer and potentially other layers within the stack of organic light emitting diode materials are selected to provide a red, green, blue, and white light emitting OLEDs. One stack of light emitting diode materials 114 emits energy primarily in the long wavelength or red portion of the visible spectrum. A second stack of light emitting diode materials 116 emits energy primarily in the middle wavelength or green portion of the visible spectrum. A third stack of light emitting diode materials 118 emits energy primarily in the short wavelength or blue portion of the visible spectrum. Finally, the fourth stack of light emitting diode materials 120 emits energy in a broad range of wavelengths, producing a white OLED. In this way, the four different materials form a four color OLED device including red, green, blue, and white OLEDs.

In this implementation, OLEDs formed from materials that are doped to produce different colors may have significantly different luminance efficiencies and therefore it may be desirable to select a white OLED with chromaticity coordinates that are biased towards the chromaticity coordinate of the OLED with the lowest power efficiency. By selecting the chromaticity coordinate of the white OLED in this way, the element with the lowest power efficiency is replaced more often by the white OLED, decreasing the overall power usage.

Further, within this implementation, the different OLEDs may need to be driven at different levels to produce a color-balanced display. It is important to realize that the stability of OLED materials is inversely related to the current density that is used to drive the OLED. The lifetime of an OLED is influenced by the current density that is used to drive the OLED, therefore, the need to drive some elements with a higher current density may shorten the life of the OLEDs of the given color. Further, OLED materials that are doped to produce different colors typically have different luminance stabilities. That is, the change in luminance output that occurs over time is different for the different materials. To account for this, a material may be employed for the white OLED having a chromaticity coordinate that is positioned closer to the OLED with the shortest luminance stability than to the chromaticity coordinates of the other gamut defining OLEDs. Positioning the white OLED according to this criteria reduces the overall usage of the closest gamut-defining OLED, extending the lifetime of the closest gamut-defining OLED.

In either of the two embodiments that have been discussed, it is important to note that because the white OLED is significantly more efficient than the red, green, or blue OLEDs the current density or power required to drive the white OLED is significantly lower than for the red, green, or blue OLEDs. It is also important to note that the luminance stability over time of the materials used to create the OLED is typically related to the current density used to drive the OLED through a very non-linear function in which the luminance stability over time of the material is much poorer when driven to higher current densities. In fact, the function used to describe this relationship can typically be described as a power function. For this reason, it is not desirable to drive any OLED to current densities that are higher than a given threshold where the function describing the luminance stability over time is particularly steep. A the same time, it may be desirable to achieve maximum display luminance values that would typically require the red, green, or blue OLEDs to be driven to this current density.

Since the current density required to drive the white OLED is significantly lower than that required to drive the red, green, or blue OLED, it will be the last of the OLEDs to reach this threshold current density. Therefore, it may be desirable to map the conventional three color data signal to the display such that the color saturation of the image is degraded while producing the desired luminance without exceeding the threshold current density for any of the three OLEDs.

This may be accomplished several ways. One way is to determine the red, green, or blue code values that will exceed this threshold, determine the difference in luminance for the display when the display is to be driven to the threshold response for any of the code values that exceed the threshold when compared to the luminance for the display when the display would be driven to the desired luminance and to add this difference in luminance to the luminance of the white OLED. Through this means, the desired display luminance is achieved without surpassing the threshold current density for the red, green, or blue OLEDs. However, the increased luminance of the display is achieved by sacrificing the color saturation of the displayed image and using the method described here, the color saturation for the highly saturated, bright colors within the image is reduced. Another way to perform this adjustment is to reduce the color saturation for all image elements within the color channel that is likely to exceed the current density or power drive limit.

In the embodiments described thus far, the various OLEDs will have different efficiencies and lifetimes. To optimize a display device for various applications it is useful to use different sized OLEDs. For example, in applications for which black-and-white use dominates, the white OLEDs can be increased in size. It should also be recognized that as the amount of luminance that is dedicated to the white OLED is manipulated, it may also be desirable to change the relative sizes of these OLEDs.

Figure 8:
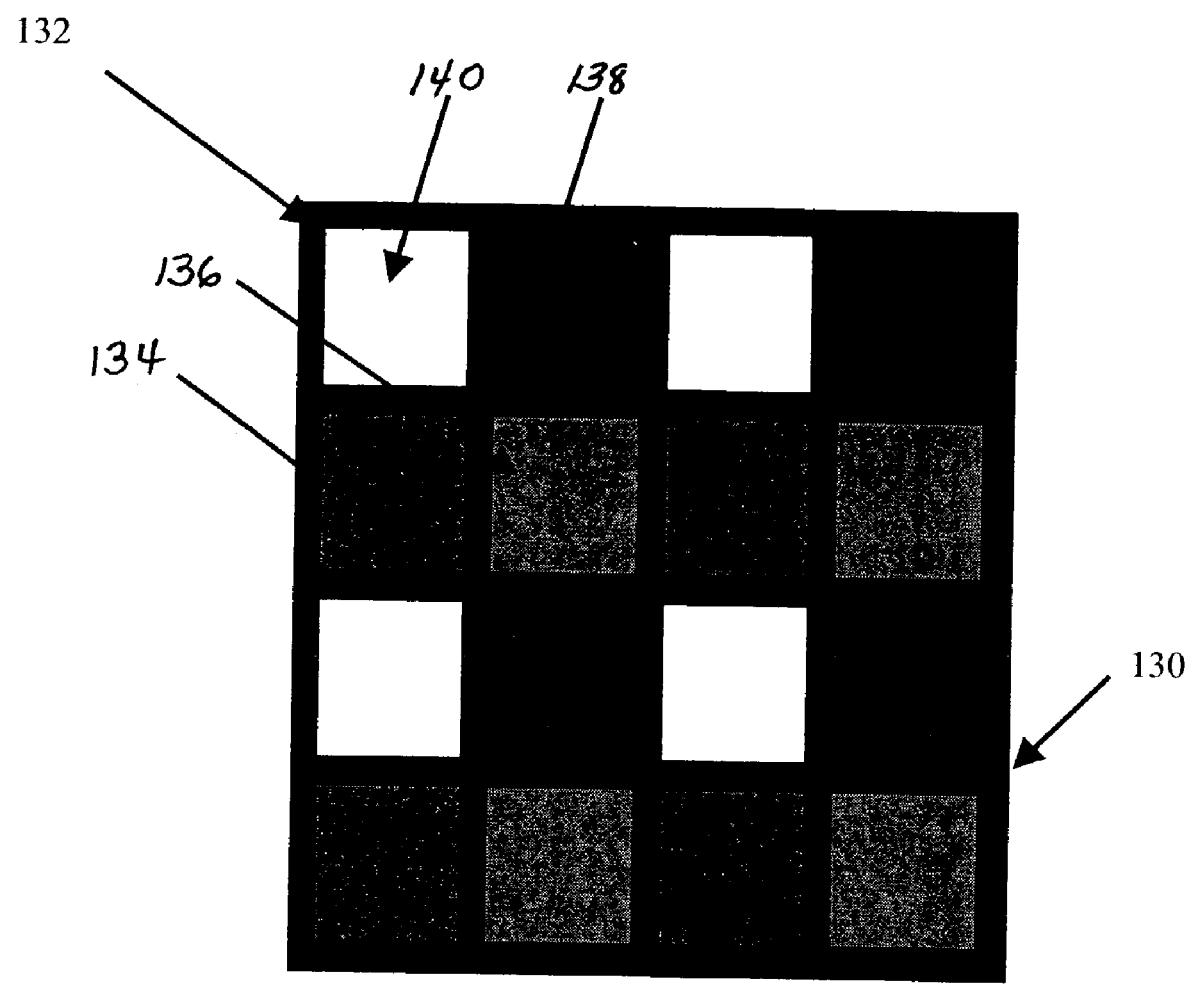
FIG. 8 is a schematic diagram illustrating a pattern of OLEDs arranged in one possible pixel pattern according to an alternative embodiment of the present invention.

Furthermore, in the two embodiments that have been discussed, different pixel layouts may also be desirable. FIG. 8 shows another potential pixel layout. As shown in FIG. 8, the display device 130 is composed of an array of pixels 132. As in the earlier implementations, the pixel 132 is composed of a red 134, green 136, blue 138 and white 140 OLED. However, within this implementation, the OLEDs are more spatially symmetric having nearly equal vertical and horizontal dimensions.

Figure 9:
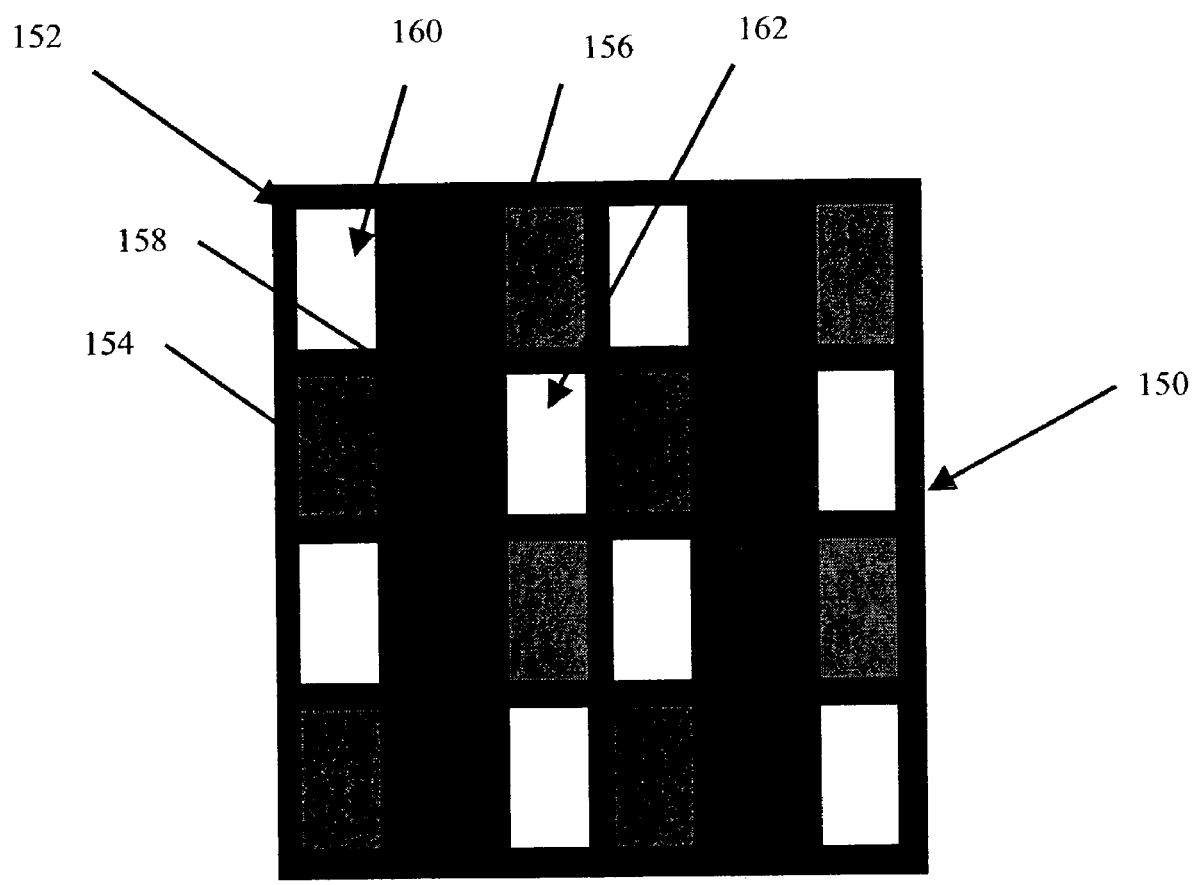
FIG. 9 is a schematic diagram illustrating a pattern of OLEDs arranged in one possible pixel pattern according to a further alternative embodiment of the present invention.

It can also be desirable to have differing resolutions of the OLEDs in a pixel. It is well known that the spatial resolution of the human visual system is much higher for luminance than for chromaticity information. Since the additional (white) OLED will carry the more luminance information than the gamut-defining OLEDs, it will be desirable to have more white OLEDs than any of the gamut-defining OLEDs. A pixel arrangement having this characteristic is shown in FIG. 9. FIG. 9 shows a display device 150 composed of an array of pixels. Each pixel 152 is composed of a red 154, a green 156, and a blue 158 OLED. Additionally, the pixel includes two white OLEDs 160 and 162. As shown, the white OLEDs are diagonally located at opposing corners of the pixel to maximize the spacing of these OLEDs. Further, the red and green OLEDs, which have the most luminance excluding the white OLEDs, are further located diagonally across the opposing corners of the pixel. Within this embodiment, the white OLED luminance that is calculated according to the method shown in FIG. 5 (step 74) or FIG. 6 is divided equally between the two white OLEDs and the code value for each of the white OLEDs is determined for one half of the calculated luminance value.

Figure 10:
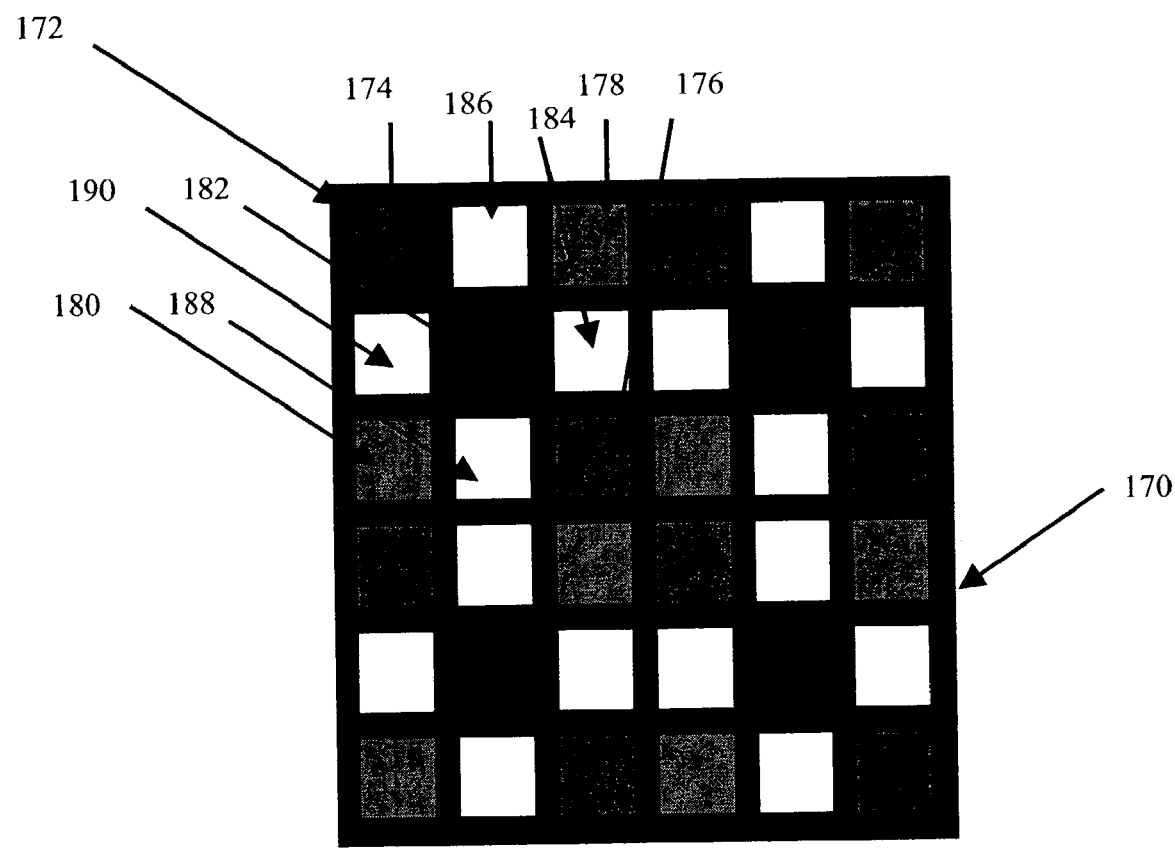
FIG. 10 is a schematic diagram illustrating a pattern of OLEDs arranged in one possible pixel pattern according to a further embodiment of the present invention.

It may be further recognized that the green and red OLEDs will carry more luminance information than the blue OLEDs, making it potentially desirable to have more red and green OLEDs than blue OLEDs within a pixel. FIG. 10 shows a display device 170 with an array of pixels. The pixel 172 is composed of two red OLEDs 174 and 176, two green OLEDs 178 and 180, one blue OLED 182 and four white OLEDs 184 through 190. As in the earlier embodiment, the OLEDs of the same color are spaced as far apart as possible within the pixel. As described earlier, the luminance for the red 174 and 176 OLEDs, the green OLEDs 178 and 180 and the white OLEDs (184 through 190) is calculated by dividing the luminance derived from the method shown in FIG. 5 (step 74) or FIG. 6 for the red, green, and white OLEDs by the number OLEDs of each color within the pixel.

Figure 11:
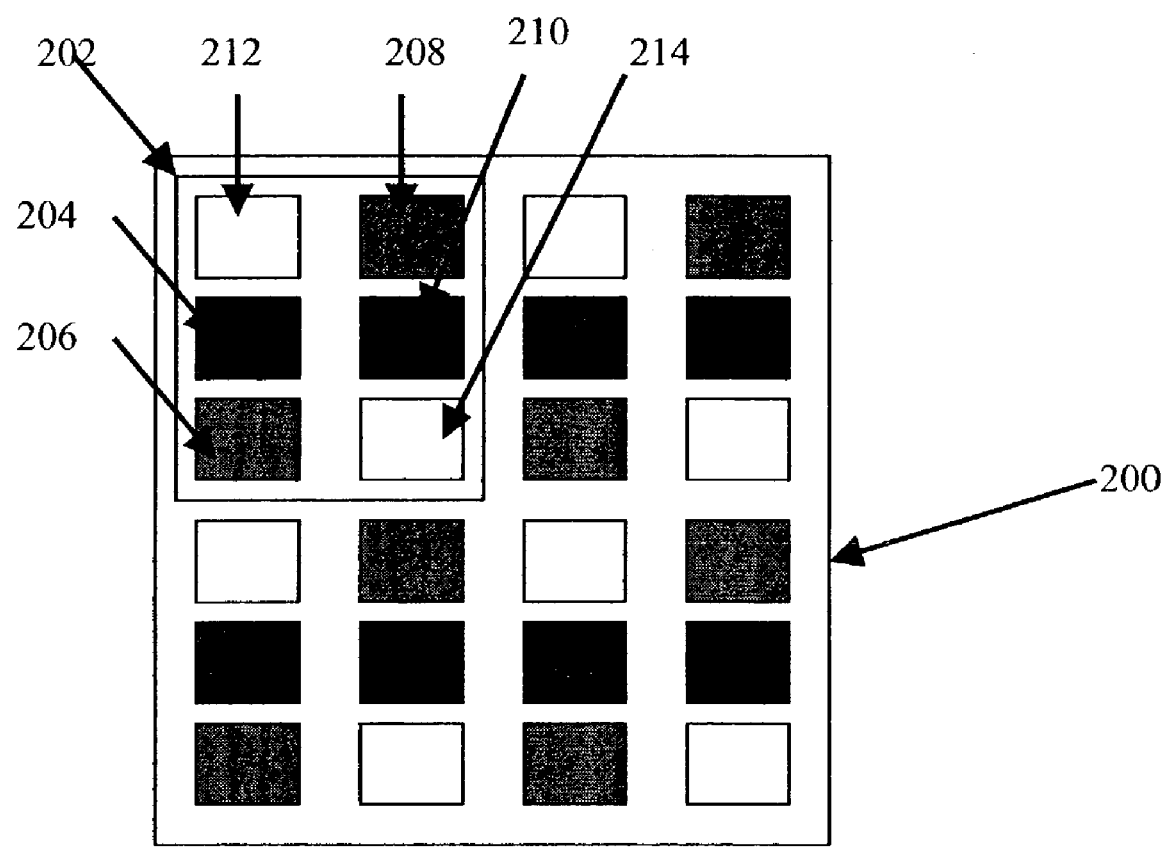
FIG. 11 is a schematic diagram illustrating a pattern of OLEDs arranged in one possible pixel pattern according to a further embodiment of the present invention.

It is also common for the red OLED to produce less luminance than the green OLED and therefore it may be desirable to have more green OLEDs within a pixel than red OLEDs. FIG. 11 shows a display device 200 with an array of pixels. The pixel 202 is composed of one red OLED 204, two green OLEDs 206 and 208, one blue OLED 210 and two white OLEDs 212 and 214. It is desirable to maximize the separation of the white 212 and 214 and green OLEDs 206 and 208 within the pixel structure. As shown in FIG. 11, this is accomplished by placing each of the white OLEDs 212 and 214 at diagonally opposing corner of the pixel. The green OLEDs 206 and 208 are also positioned at diagonally opposing corners of the pixel 202. As described earlier, the luminance for the green OLEDs 206 and 208 and the white OLEDs 212 and 214 is calculated by dividing the luminance derived from the method shown in FIG. 5 (step 74) or FIG. 6 for the green and white OLEDs by the number OLEDs of the green and white OLEDs within the pixel 202.

It should be noted that any of the different patterns of OLEDs that are used to define a pixel that the relative areas of the different OLEDs may be adjusted to preserve the lifetime to balance the lifetime of the different OLEDs within a pixel. It should also be noted that the interpolation algorithms that were discussed earlier to enhance the perceived resolution of the OLED display device may also be applied in any of these patterns.

It should also be recognized that while one reason for using more OLEDs of one color than another is to improve the perceived sharpness of the OLED display device, it may also be desirable to use fewer OLEDs of one color than another (assuming that the OLEDs all have the same light emitting area) for a different reason. For example, to balance the lifetime of the different colored OLEDs, one may wish to utilize fewer white OLEDs than red, green, or blue OLEDs simply because the white materials that are known to be available to create a white OLED today have higher power efficiency and stability and therefore are likely to have a longer lifetime than the red, green, or blue OLEDs. Therefore, it may be desirable to produce a pixel on an OLED display device having fewer white OLEDs that are driven at higher current densities while providing more red, green, or blue OLEDs that are driven at lower current densities.

Figure 12:
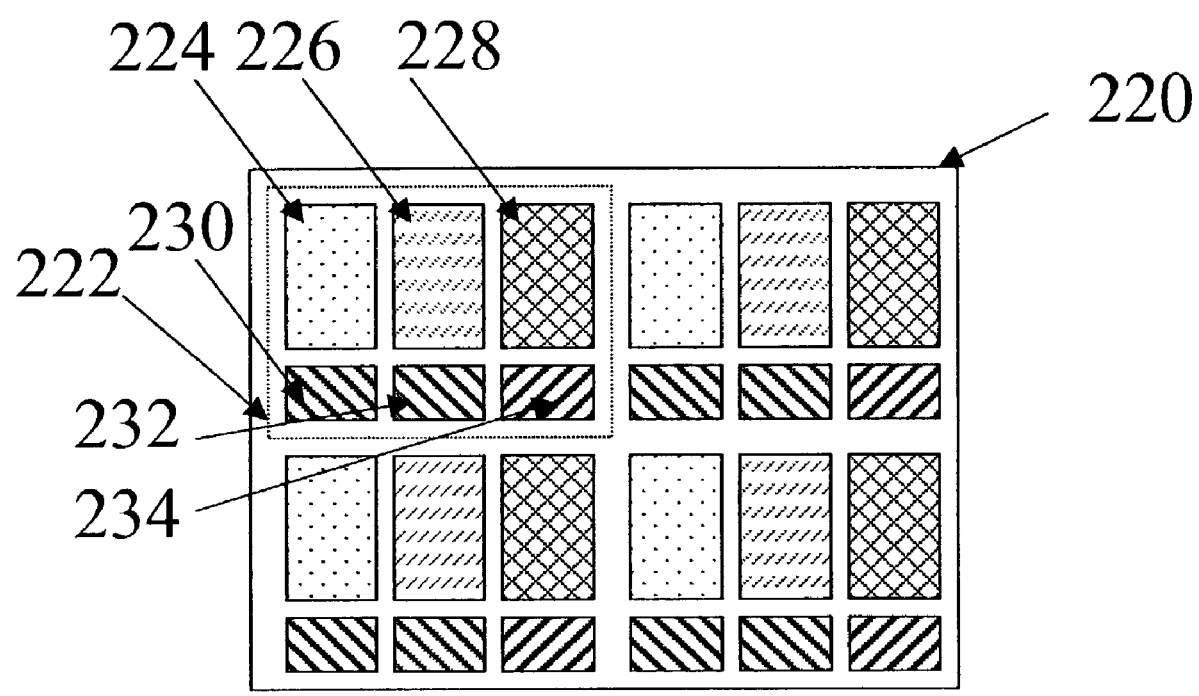
FIG. 12 is a schematic diagram illustrating an alternative pattern of OLEDs according to one embodiment of the present invention.

Another embodiment is shown in FIG. 12. Within this embodiment, the display device 220 is composed of an array of pixels. Each pixel 222, is composed of a series of six OLEDs with three, highly saturated, red, green and blue OLEDs 230, 232, and 234 defining the gamut of the display and three similarly colored OLEDs 224, 226 and 228 with lower saturation but higher power efficiency defining a sub-gamut within the display. Under conditions where primarily low saturation images are expected to be displayed, the OLEDs that are used to create the sub-gamut in the display will allow all unsaturated colors to be displayed with a high power efficiency but the presence of the higher saturation OLEDs will allow the presentation of information with higher saturation at the expense of a loss in power efficiency. It should be noted that this embodiment could employ either color filters or OLED materials that are doped to produce different colored light emission.

EXAMPLE 1 (COMPARATIVE)

To demonstrate the usefulness of this invention, the power consumption of a hypothetical display constructed according to a conventional approach can be calculated and this power consumption can be compared to a preferred embodiment of this invention.

To provide this demonstration, a number of conditions must be established. Among these conditions is some characterization of the content to be displayed. Table 1 shows colors that will be assumed for a typical graphical display screen, their code values, and the percent of the screen covered by each color. In this example, the assumed application might show a white background over the majority of the display, some black text that covers the majority of the screen and therefore consumes 20 percent of the screen real estate, gray tool bars that fill around 10 percent of the screen, and an unsaturated or light blue title bar that fills around 5 percent of the screen. Also shown might be some saturated red and green icons, each covering 2 percent of the screen.

TABLE 1

Screen content to be displayed.

| Color Name | Red Code Value | Green Code Value | Blue Code Value | Percent of Screen |
|---|---|---|---|---|
| White | 255 | 255 | 255 | 61 |
| Black | 0 | 0 | 0 | 20 |
| Gray | 125 | 125 | 125 | 10 |
| Light Blue | 125 | 125 | 255 | 5 |
| Red | 255 | 0 | 0 | 2 |
| Green | 0 | 255 | 0 | 2 |

Many display characteristics are also quite important in determining the power required to display the screen described in Table 1. Table 2 shows many of the important display characteristics that will be important in this and comparative examples. Table 3 shows many of the characteristics for each OLED that will impact the display power calculations.

TABLE 2

Display Characteristics

| Display Characteristic | Value | |
|---|---|---|
| Horizontal Pixels | 320 | |
| Vertical Pixels | 240 | |
| Horizontal Display Dimension | 3.04 | inches |
| Vertical Display Dimension | 2.28 | inches |
| Fill Factor | 60% | |
| X chromaticity coordinate for white | 0.3128 | |
| Y chromaticity coordinate for white | 0.3293 | |
| Power efficiency for white emitter | 75 | A/sq M |
| Assumed Gamma | 1.0 | |
| Peak Luminance | 100 | cd/sq m |

TABLE 3

OLED Characteristics

| OLED Characteristic | Red | Green | Blue |
|---|---|---|---|
| X chromaticity coordinate | 0.649 | 0.312 | 0.147 |

TABLE 3-continued

OLED Characteristics

| OLED Characteristic | Red | Green | Blue |
|---|---|---|---|
| Y chromaticity coordinate | 0.347 | 0.620 | 0.191 |
| Color filter transmittance | 33% | 54% | 37% |

Using each individual set of code values in Table 1 and assuming the characteristics as shown in Table 2, the red, green, and blue luminance required from a OLED to generate a color balanced image can be computed. Using this luminance value at the display surface and OLED characteristics such as the color filter transmittance and fill factor, the luminance for each OLED can then be calculated. Next by applying the power efficiency for the white emitter, the amount of current required to drive each OLED to the necessary luminance is then calculated and this current is multiplied by an assumed voltage (9 Volts in this example) to calculate the power for each OLED. Finally, this power is multiplied by the number of each OLED on the display to calculate the power required to drive each color OLED to illuminate the display to the desired color. The resulting power values are shown in the columns labeled Red OLEDs, Green OLEDs, and Blue OLEDs in Table 4. The power required to illuminate all OLEDs on the display to present each color over the entire display is then calculated by summing the power for all OLEDs. These values are shown in the column labeled Power in Table 4.

TABLE 4

Power (in Watts) required to display the colors listed in Table 1

| Color Name | Red OLEDs | Green OLEDs | Blue OLEDs | Power |
|---|---|---|---|---|
| White | 0.537 | 0.537 | 0.537 | 1.610 |
| Black | 0 | 0 | 0 | 0 |
| Gray | 0.269 | 0.269 | 0.269 | 0.808 |
| Light Blue | 0.269 | 0.269 | 0.537 | 1.075 |
| Red | 0 | 0 | 0.537 | 0.537 |
| Green | 0.537 | 0 | 0 | 0.537 |

The values shown in Table 4 are then weighted by their usage as indicated by percent of screen in Table 1 and an average power draw is calculated. In this way, it can be shown that to display this example screen the display will draw approximately 1.14 Watts of power.

EXAMPLE 2 (INVENTIVE)

This same display can be constructed using a display structure according to the first embodiment of the present invention. In this example, it will be assumed that a white OLED will be added to the red, green, and blue OLEDs but that the total area of each OLED will be decreased to provide the same total fill factor. Additionally, it will be assumed that no color filter is placed over the white OLED and therefore the transmittance of this OLED is 100%. Finally, it will be assumed that the chromaticity coordinates for this white OLED matches the white point of the display.

Using the same approach as in the previous example, power values can be calculated for this display. The power needed to drive the display to each color is shown in Table 5 and this table can be compared directly to Table 4. Notice that the white OLED is to generate all of the luminance in the white and gray areas and therefore only the white OLED uses power when these colors are produced. Further, since no color filter is used to absorb luminance energy from this OLED, it is much more efficient than the combination of the red, green, and blue OLEDs that were used to generate this same luminance energy in the previous example. It should also be noticed that the white OLED is also used to generate luminance energy that was originally supplied by the combination of red, green, and blue OLEDs when generating the light blue condition and therefore the power required to generate this color is reduced in this example over the previous example. Finally, since the red and green colors were fully saturated and composed of red and green in OLEDs in the previous example, they continue to be fully saturated and composed of only light from the red and green OLEDs in this example. Therefore the power used to generate the red and green colors is equivalent in the two examples.

TABLE 5

Power required to display the colors listed in Table 1

| Color Name | Red OLEDs | Green OLEDs | Blue OLEDs | White OLEDs | Power |
|---|---|---|---|---|---|
| White | 0 | 0 | 0 | 0.537 | 0.537 |
| Black | 0 | 0 | 0 | 0 | 0 |
| Gray | 0 | 0 | 0 | 0.269 | 0.269 |
| Light Blue | 0 | 0 | 0.269 | 0.269 | 0.539 |
| Red | 0 | 0 | 0.537 | | 0.537 |
| Green | 0.537 | 0 | 0 | | 0.537 |

When the values shown in Table 6 are weighted by their usage as indicated by percent of screen in Table 1, it can be determined that to display this example screen the display will draw approximately 0.403 Watts of power. It should be noted that this value is significantly lower than the power that would be drawn by the same display without the white OLED which is 1.14 Watts as computed in the previous example for comparison.

EXAMPLE 3 (COMPARATIVE)

To demonstrate the usefulness of this invention when applied to a display created using different OLED materials as described in the second preferred embodiment of this disclosure, it is first necessary to compute the power required by a typical prior art display that is constructed using different OLED materials. In this example, we will assume this display has similar characteristics to the display described in Example 1. The additional data that is required is the efficiencies of the red, green, and blue OLEDs as these efficiencies will replace the information on the filter transmittance values and the power efficiency of the white emitter. In this example, efficiencies are assumed to be 25 A/sq m for the red OLED, 70 A/sq m for the green OLED and 20 A/sq m for the blue OLED.

Using this data, combined with the data in Tables 1, 2 and 3, allows the power values shown in Table 6 to be calculated. Notice that these values are only slightly different than the calculated values shown in Table 4 for Example 1.

TABLE 6

Power required to display the colors listed in Table 1

| Color Name | Red OLEDs | Green OLEDs | Blue OLEDs | Power |
|---|---|---|---|---|
| White | 0.531 | 0.310 | 0.744 | 1.586 |
| Black | 0 | 0 | 0 | 0 |
| Gray | 0.267 | 0.156 | 0.374 | 0.796 |
| Light Blue | 0.267 | 0.156 | 0.744 | 1.167 |
| Red | 0.531 | 0 | 0 | 0.531 |
| Green | 0 | 0.310 | 0 | 0.310 |

When the values shown in Table 6 are weighted by their usage as indicated by percent of screen in Table 1 and averaged, it can be determined that to display this example screen the display will draw approximately 1.122 Watts of power.

EXAMPLE 4 (INVENTIVE)

This same display can be constructed using a display structure according to the second embodiment of the present invention. In this example, it will be assumed that a white OLED will be added to the red, green, and blue OLEDs but that the total area of each OLED will be decreased to provide the same total fill factor. Additionally, it will be assumed that the white OLED will have a power efficiency of 75 A/sq m. Finally, it will be assumed that the chromaticity coordinates for this white OLED matches the white point of the display.

Using the same approach as in the previous example, power values can be calculated for this display. The power needed to drive the display to each color is shown in Table 7 and this table can be compared directly to Table 4. Notice that the white OLED is once again used to generate all of the luminance in the white and gray areas and therefore only the white OLED uses power when these colors are produced. Further, since no color filter is used to absorb luminance energy from this OLED, it is much more efficient than the combination of the red, green, and blue OLEDs that were used to generate this same luminance energy in the previous example. It should also be noticed that the white OLED is also used to generate luminance energy that was originally supplied by the combination of red, green, and blue OLEDs when generating the light blue condition and therefore the power required to generate this color is reduced in this example over the previous example. Finally, since the red and green colors were fully saturated and composed of either red or green OLEDs in the previous example, they continue to be fully saturated and composed of only light from the red and green OLEDs in this example. Therefore the power used to generate the red and green colors is equivalent in the two examples.

TABLE 7

Power required to display the colors listed in Table 1

| Color Name | Red OLEDs | Green OLEDs | Blue OLEDs | White OLEDs | Power |
|---|---|---|---|---|---|
| White | 0 | 0 | 0 | 0.537 | 0.537 |
| Black | 0 | 0 | 0 | 0 | 0 |
| Gray | 0 | 0 | 0 | 0.269 | 0.269 |
| Light Blue | 0 | 0 | 0.374 | 0.269 | 0.539 |
| Red | 0.531 | 0 | 0 | 0 | 0.531 |
| Green | 0 | 0.310 | 0 | | 0.310 |

When the values shown in Table 7 are weighted by their usage as indicated by percent of screen in Table 1, it can be determined that to display this example screen the display will draw approximately 0.403 Watts of power. It should be noted that this value is significantly lower than the power that would be drawn by the same display without the white OLED which is 1.122 Watts as computed in the previous example for comparison.

The invention has been described in detail with particular reference to certain preferred embodiments thereof, but it will be understood that variations and modifications can be effected within the spirit and scope of the invention.

PARTS LIST 2 chromaticity coordinate of a red OLED
4 chromaticity coordinate of a green OLED
6 chromaticity coordinate of a blue OLED
10 color OLED display device
12 pixel
20 red light emitting OLED
22 green light emitting OLED
24 blue light emitting OLED
26 in-gamut OLED
30 substrate
32 red color filter
34 green color filter
36 blue color filter
38 white or transparent color filter
40 anode
42 hole injecting layer
44 hole transporting layer
46 light emitting layer
48 electron transporting layer
50 cathode
60 determine chromaticity coordinate of desired white step
62 determine chromaticity coordinate of each OLED step
64 calculate peak luminance step
66 determine chromaticity coordinates and tonescale for standard input step
68 calculate chromaticity coordinates step
70 divide CIE chromaticity coordinate step
72 determine code value combination step
74 calculate chromaticity coordinate step
76 determine relationship step
78 calculate code value combination step
80 luminance and chromaticity determining step
81 chromaticity determining step
82 peak luminance calculating step
84 matrix calculating step
86 video input step
88 luminance calculating step
90 normalizing step
92 common luminance calculating step
93 fraction selection step
94 luminance subtraction step
95 luminance addition step
96 renormalization step
97 combination step
98 code value determining step
99 code value look up table determining step
100 substrate
102 anode
104 hole injecting layer
106 hole transporting layer
108 light emitting layer
110 electron transporting layer
112 cathode
114 stack of red light emitting materials
116 stack of green light emitting materials
118 stack of blue light emitting materials
120 stack of white light emitting materials
130 display device
132 pixel
134 red OLED
136 green OLED
138 blue OLED
140 white OLED
150 display device
152 pixel
154 red OLED
156 green OLED
158 blue OLED
160 first white OLED
162 second white OLED
170 display device
172 pixel
174 first red OLED
176 second red OLED
178 first green OLED
180 second green OLED
182 blue OLED
184 first white OLED
186 second white OLED
188 third white OLED
190 fourth white OLED
200 display device
202 pixel
204 red OLED
206 first green OLED
208 second green OLED
210 blue OLED
212 first white OLED
214 second white OLED
220 display device
222 pixel
224 first low saturation OLED
226 second low saturation OLED
228 third low saturation OLED
230 first saturated OLED
232 second saturated OLED
234 third saturated OLED

What is claimed is:

1. An OLED display device, comprising:
a) an array of light emitting pixels, each pixel having three or more OLEDs for emitting different colors of light specifying a gamut and at least one additional OLED for emitting a color of light within the gamut, wherein the power efficiency of the additional OLED is higher than the power efficiency of at least one of the three or more OLEDs; and
b) means for driving the OLEDs in the pixels to produce a given color and luminance at a reduced power usage, wherein the means for driving produces in-gamut colors using a combination of light from the additional OLED and light from the three or more OLEDs;
wherein the three or more OLEDs and the additional OLED comprise the same light emitting material, the three or more OLEDs further comprise different color filters for producing the different colors of light specifying the gamut, and filtered light emitted by each of the three or more OLEDs has a narrower bandwidth than a bandwidth of light emitted by the additional OLED).

2. The OLED display device claimed in claim 1, wherein the three or more OLEDs emit red, green; and blue colors of light.

3. The OLED display device claimed in claim 1, wherein the additional OLED emits white light.

4. The OLED display device claimed in claim 3, wherein the white light emitted by the additional OLED matches the white point of the display.

5. The OLED display device claimed in claim 1, wherein the OLEDs are of different sizes.

6. The OLED display device claimed in claim 1, wherein the additional OLED is larger than the three or more OLEDs.

7. The OLED display device in claim 1, wherein the OLED display device is a top emitting OLED device.

8. The OLED display device in claim 1, wherein the OLED display device is a bottom emitting OLED device.

9. The OLED display device in claim 1, wherein the OLED display device is an active matrix device.

10. The OLED display device in claim 1, wherein the OLED display device is a passive matrix device.

11. The OLED display device claimed in claim 1, wherein the means the driving reduces power usage to a minimum by maximizing the use of the additional OLEDs within each pixel.

12. The OLED display device claimed in claim 1, wherein the means for driving includes means for reducing the saturation of the display to increase brightness.

13. The OLED display device claimed in claim 1, having three additional OLEDs for emitting three colors of light within gamut.

14. The OLED display device claimed in claim 1, wherein the means for driving further comprises means for trading off power usage for image quality.

15. The OLED display device claimed in claim 14, wherein image quality includes one or more of color fringing, edge smoothness and sharpness.

16. The OLED display device claimed in claim 1, wherein the means for driving further comprises means for trading off power usage for display lifetime.

17. The OLED display device claimed in claim 1, wherein the color of light emitted by the additional OLED) is selected to improve the lifetime of the display.

18. The OLED display device claimed in claim 1, wherein the means for driving performs a conversion from an RGB signal to a device drive signal by calculation in real time.

19. The OLED display device claimed in claim 1, wherein the means for driving performs a conversion from an RGB signal to a device drive signal by reference to a look-up table.

20. The OLED display device claimed in claim 1, wherein each pixel further comprises one or more OLEDs for emitting a color of light that is the same color as the light emitted by the three or more OLEDs or the additional OLED(s).

21. The OLED display device claimed in claim 20, the one or more OLEDs emit light that is the same color as light emitted by one or more of the additional OLED(s).

22. The OLED display device claimed in claim 20, wherein the one or more OLEDs emit light that is the same color as light emitted by one or more of the three or more OLED(s).

23. The OLED display device claimed in claim 20, wherein the three or more OLEDs emit red, green, and blue colors of light, and wherein there are more green light emitting OLEDs than red or blue light emitting OLEDs.

24. The OLED display device claimed in claim 20, wherein the three or more OLEDs emit red, green and blue colors of light, and wherein there are more red light emitting OLEDs than blue light emitting OLEDs.

25. The OLED display device claimed in claim 1, wherein the three or more OLEDs emit red, green, and blue colors of light, and the additional OLED emits white light.

26. The OLED display device claimed in claim 25, wherein the peak luminance of the white additional OLED is set to a value from one half to one and a half times the peak luminance of the combined red, green and blue OLEDs.

27. The OLED display device claimed in claim 26, wherein the peak luminance of the white additional OLED is set to match the peak luminance of the combined red, green and blue OLEDs.

28. A method of reducing the power usage of an OLED display device, comprising the steps of:
  a) providing a display having an array of light emitting pixels, each pixel having three or more OLEDs for emitting different colors of light specifying a gamut and at least one additional OLED for emitting a color of light within the gamut, wherein the power efficiency of the additional OLED is higher than the power efficiency of at least one of the three or more OLEDs; and
  b) driving the OLEDs in the pixels to produce a given color and luminance at a reduced power usage, wherein the step of driving produces in-gamut colors using a combination of light from the additional OLED and light from the three or more OLEDs;
  wherein the three or more OLEDs and the additional OLED comprise the same light emitting material, the three or more OLEDs further comprise different color filters for producing the different colors of light specifying the gamut, and filtered light emitted by each of the three or more OLEDs has a narrower bandwidth than a bandwidth of light emitted by the additional OLED.

29. The method claimed in claim 28, wherein the three or more OLEDs emit red, green, and blue colors of light.

30. The method claimed in claim 28, wherein the additional OLED emits white light.

31. The method claimed in claim 28, wherein the OLEDs are of different sizes.

32. The method claimed in claim 28, wherein the additional OLED is larger than the three or more OLEDs.

33. The method in claim 28, wherein the OLED display device is a top emitting OLED device.

34. The method in claim 28, wherein the OLED display device is a bottom emitting OLED device.

35. The method in claim 28, wherein the OLED display device is an active matrix device.

36. The method in claim 28, wherein the OLED display device is a passive matrix device.

37. The method claimed in claim 28, wherein the stop of driving reduces power usage to a minimum by maximizing the use of the additional OLEDs within each pixel.

38. The method claimed in claim 28, wherein the step of driving includes means for reducing the saturation of the display to increase brightness.

39. The method claimed in claim 28, wherein the display has three additional OLEDs for emitting three colors of light within gamut.

40. The method claimed in claim 28, wherein the step of driving further comprises trading off power usage for image quality.

41. The method claimed in claim 28, wherein the step of driving further comprises trading off power usage for display lifetime.

42. The method claimed in claim 28, wherein the color of light emitted by the additional OLED is selected to improve the lifetime of the display.

43. The method claimed in claim 28, wherein the step of driving includes performing a conversion from an RGB signal to a device drive signal by calculation in real time.

44. The method claimed in claim 28, wherein the step of driving includes performing a conversion from an RGB signal to a device drive signal by referencing a look-up table.

45. The method claimed in claim 28, wherein each pixel further comprises one or more OLEDs for emitting a color of light that is the same color as the light emitted by the three or more OLEDs or the additional OLED(s).

46. The method claimed in claim 45, the one or more OLEDs emit light that is the same color as light emitted by one or more of the additional OLED(s).

47. The method claimed in claim 45, wherein the one or more OLEDs emit light that is the same color as light emitted by one or more of the three or more OLED(s).

48. The method claimed in claim 45, wherein the three or more OLEDs emit red, green and blue colors of light, and wherein there are more green light emitting OLEDs than red or blue light emitting OLEDs.

49. The method claimed in claim 45, wherein the three or more OLEDs emit red, green, and blue colors of light, and wherein there are more red light emitting OLEDs than blue light emitting OLEDs.

* * * * *